US012740245B2

(12) United States Patent
Son et al.

(10) Patent No.: US 12,740,245 B2
(45) Date of Patent: Sep. 15, 2026

(54) LIGHT-EMITTING DISPLAY DEVICE AND METHOD OF MANUFACTURING THE SAME

(71) Applicant: LG Display Co., Ltd., Seoul (KR)

(72) Inventors: Seok-Woo Son, Paju-si (KR); Jung-Sun Baek, Paju-si (KR); Jo-Yeon Kim, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 45 days.

(21) Appl. No.: 18/123,770

(22) Filed: Mar. 20, 2023

(65) Prior Publication Data

US 2023/0232665 A1 Jul. 20, 2023

Related U.S. Application Data

(62) Division of application No. 17/119,210, filed on Dec. 11, 2020.

(30) Foreign Application Priority Data

Dec. 12, 2019 (KR) ........................ 10-2019-0165715

(51) Int. Cl.
*H10K 59/122* (2023.01)
*G09G 3/3225* (2016.01)
*H10K 59/12* (2023.01)

(52) U.S. Cl.
CPC ......... *H10K 59/122* (2023.02); *G09G 3/3225* (2013.01); *G09G 2300/0842* (2013.01); *H10K 59/1201* (2023.02)

(58) Field of Classification Search
CPC ... H10K 59/122; H10K 59/1201; H10K 71/00
USPC .......................................................... 257/88
See application file for complete search history.

(56) References Cited

U.S. PATENT DOCUMENTS

2014/0312329 A1* 10/2014 Fujii ................ H10K 59/80522 438/34
2014/0346459 A1 11/2014 Song et al.
2015/0179719 A1 6/2015 Nam et al.
2016/0043341 A1 2/2016 Heo et al.
(Continued)

FOREIGN PATENT DOCUMENTS

CN 104659070 A 5/2015
CN 110010644 A 7/2019
(Continued)

*Primary Examiner* — Dzung Tran
(74) *Attorney, Agent, or Firm* — Birch, Stewart, Kolasch & Birch, LLP

(57) ABSTRACT

A light-emitting display device can include a plurality of first electrodes over a substrate; a bank to overlap an area between the first electrodes and an edge of each of the first electrodes; a bank recess in the bank at the area between the first electrodes; a hard mask pattern to partially overlap the bank recess and to abut an upper part of the bank; an organic layer on the first electrodes and the bank, the organic layer being discontinuous between an upper part of the hard mask layer pattern and the bank recess; and a second electrode. Also, the bank can include a bank lower portion having a first height under the bank recess, a bank body portion around the bank recess, the bank body portion having an acute taper with respect to the substrate, and a bank overlap portion to overlap the plurality of first electrodes.

21 Claims, 11 Drawing Sheets

(56) References Cited

U.S. PATENT DOCUMENTS

2016/0079325 A1* 3/2016 Lee ........................ H10K 71/00
438/26
2016/0079334 A1* 3/2016 Lee ........................ H10K 71/00
438/34
2016/0149156 A1* 5/2016 Kim ..................... H10K 50/828
438/46
2016/0190225 A1 6/2016 Kim et al.
2017/0033166 A1* 2/2017 Shim .................. H10K 59/1315
2017/0117337 A1* 4/2017 Kimura .................. H10K 71/00
2017/0117349 A1* 4/2017 Jeon ..................... H10K 59/122
2017/0317154 A1* 11/2017 Heo ................... H10K 59/1315
2018/0120620 A1 5/2018 Shim et al.
2019/0103418 A1* 4/2019 Han .................... H01L 27/1218
2019/0165062 A1 5/2019 Heo

FOREIGN PATENT DOCUMENTS

KR 10-2016-0047110 A 5/2016
KR 10-2018-0013225 A 2/2018

* cited by examiner

LIGHT-EMITTING DISPLAY DEVICE AND METHOD OF MANUFACTURING THE SAME

CROSS-REFERENCE TO RELATED APPLICATIONS

This application is a Divisional Application of U.S. patent application Ser. No. 17/119,210, filed on Dec. 11, 2020 (now U.S. Pat. No. 11,641,766, issued on May 2, 2023), which claims the priority benefit of Korean Patent Application No. 10-2019-0165715, filed on Dec. 12, 2019 in the Republic of Korea, the entire contents of all these applications are hereby expressly incorporated by reference as if fully set forth herein into the present application.

BACKGROUND OF THE INVENTION

Field of the Invention

The present invention relates to a display device, and more particularly to a light-emitting display device capable of preventing leakage of current between adjacent subpixels and a method of manufacturing the same.

Discussion of the Related Art

With recent approach to a full-scale information age, displays capable of visually expressing electrical information signals have been rapidly developed. Correspondingly, various flat panel display devices having excellent performance, such as slimness, light weight, and low power consumption, have been developed and have rapidly replaced a conventional cathode ray tube (CRT) display device.

Concrete examples of the flat panel display devices include a liquid crystal display (LCD) device, a plasma display panel (PDP) device, a field emission display (FED) device, and an organic light-emitting display (OLED) device.

Thereamong, the organic light-emitting display device, which does not require a separate light source, has a compact structure, and is capable of displaying vivid colors, is considered as a competitive application.

Meanwhile, the organic light-emitting display device includes a common layer commonly subpixels, and lateral leakage of current occurs through a common layer. Therefore, efforts to address this problem have been made.

SUMMARY OF THE INVENTION

Accordingly, the present invention is directed to a light-emitting display device and a method of manufacturing the same that substantially obviate one or more problems due to limitations and disadvantages of the related art.

An object of the present invention is to provide a light-emitting display device configured so that an organic layer is formed so as to be divided between adjacent subpixels through a change in structure of a bank without provision of an additional construction, whereby it is possible to prevent lateral leakage of current, and to provide a method of manufacturing the same.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

In a light-emitting display device according to one or more embodiments of the present invention, a recess is provided in a bank, whereby an organic layer is separated from the recess, and therefore separation of the organic layer between subpixels is achieved and thus it is possible to structurally prevent lateral leakage of current.

To achieve these objects and other advantages and in accordance with the purpose of the invention, as embodied and broadly described herein, a light-emitting display device includes a plurality of first electrodes spaced apart from each other on a substrate, a bank provided to overlap an area between the first electrodes and the edge of each of the first electrodes, a bank recess provided in the bank at the area between the first electrodes, an organic layer on the first electrodes and the bank, the organic layer being discontinuous between the upper part of the bank and the bank recess, and a second electrode on the organic layer.

In another aspect of the present invention, a light-emitting display device includes a plurality of first electrodes spaced apart from each other on a substrate, a bank to overlap an area between the first electrodes and the edge of each of the first electrodes, a bank recess provided in the bank at the area between the first electrodes, a hard mask layer pattern so as to partially overlap the bank recess and to abut the upper part of the bank, an organic layer on the first electrodes and the bank, the organic layer being discontinuous between the upper part of the hard mask layer pattern and the bank recess, and a second electrode on the organic layer.

In a further aspect of the present invention, a method of manufacturing a light-emitting display device includes providing a plurality of first electrodes spaced apart from each other on a substrate, providing a bank so as to overlap an area between the first electrodes and the edge of each of the first electrodes, providing a bank recess in the bank at the area between the first electrodes, providing an organic layer on the first electrodes and the bank, the organic layer being discontinuous between the upper part of the bank and the bank recess, and providing a second electrode on the organic layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
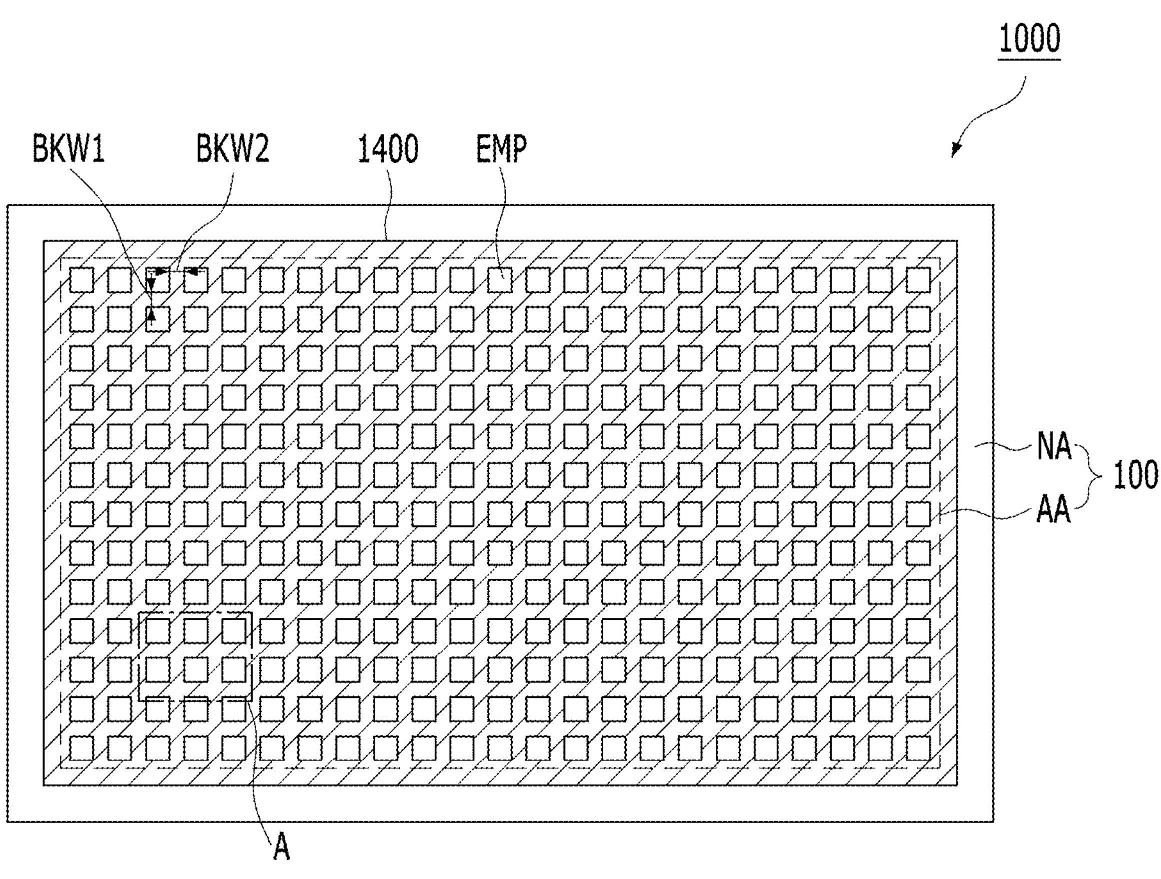
FIG. 1 is a plan view showing a light-emitting display device according to one or more embodiments the present invention.

Reference will now be made in detail to the preferred embodiments of the present invention, examples of which are illustrated in the accompanying drawings. Wherever possible, the same reference numbers will be used throughout the drawings to refer to the same or like parts. In the following description of the present invention, a detailed description of known functions and configurations incorporated herein will be omitted when it can obscure the subject matter of the present invention. In addition, the terms used in the following description are selected in consideration of ease of preparation of the specification, and can be different from the names of parts constituting an actual product.

Shapes, sizes, ratios, angles, and numbers shown in the drawings to describe the embodiments of the present invention are illustrative and thus are not limitative of the disclosure of the present invention. Wherever possible, the same reference numbers will be used throughout the drawings to refer to the same or like parts. Also, in the following description of the present invention, a detailed description of known technology incorporated herein will be omitted when it can obscure the subject matter of the present invention. In the case in which the terms "comprises," "has," or "includes" are used in this specification, other parts can be further added unless the term "only" is used. The singular forms are intended to include the plural forms as well, unless the context clearly indicates otherwise.

In interpreting components included in various embodiments of the present invention, it is to be interpreted that an error range is included unless the context clearly indicates otherwise.

In explaining various embodiments of the present invention, when a positional relationship is described, for example, when the positional relationship between two parts is described using terms such as "on", "above," "under," "beside," etc., one or more additional parts can be located between the two parts unless the term "immediately" or "directly" is used.

In explaining various embodiments of the present invention, when a temporal relationship is described, for example, when time sequences such as "after," "subsequently," "next," and "before" are described, discontinuous sequences can be included unless the term "immediately" or "directly" is used.

In explaining various embodiments of the present invention, the terms "first," "second," etc. are used to describe various elements. However, these terms are used only to distinguish between the elements and may not define order. In this specification, therefore, a component identified by "first" can be identical to a component identified by "second" within the technical spirit of the present invention unless the context clearly indicates otherwise.

Features of various embodiments of the present invention can be partially or entirely coupled to or combined with each other, and can be technically interlocked and driven in various manners. Various embodiments can be realized independently or in combination with each other.

Figure 2:
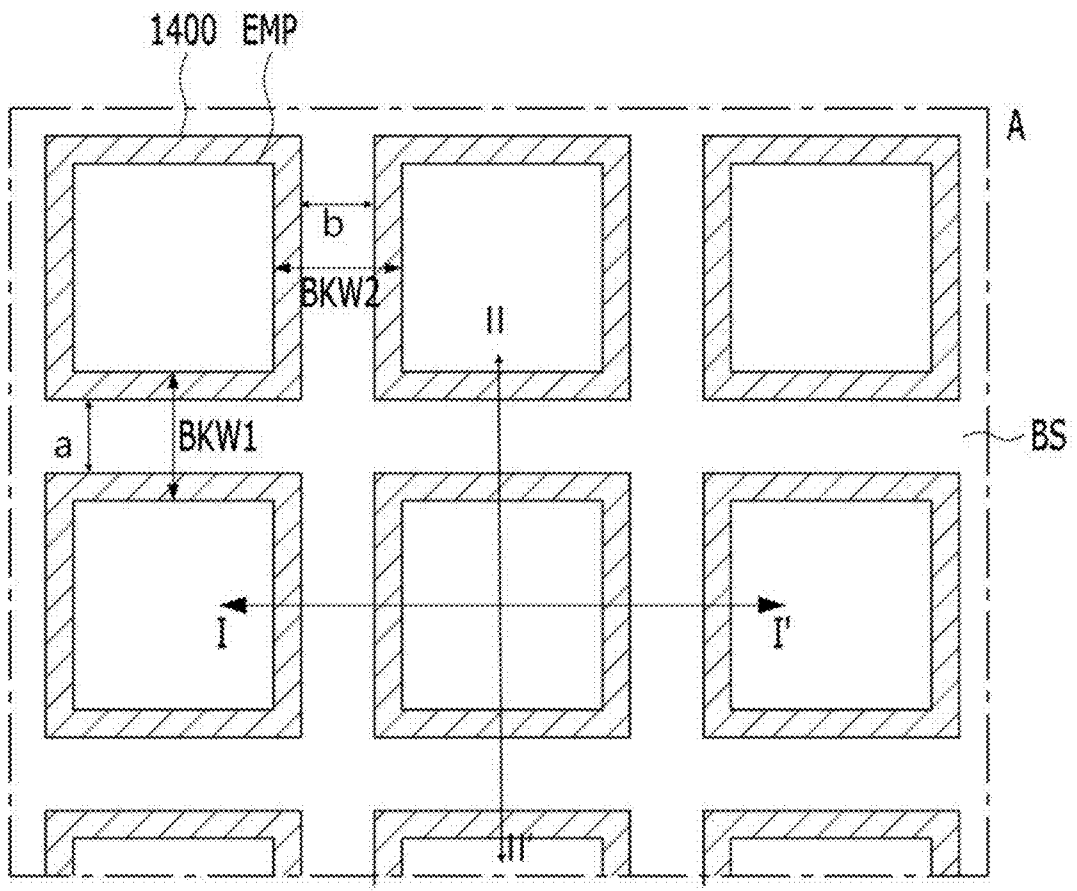
FIG. 2 is an enlarged view of area A of FIG. 1.

FIG. 1 is a plan view showing a light-emitting display device according to one or more embodiments of the present invention, and FIG. 2 is an enlarged view of area A of FIG. 1. All the components of the light-emitting display device according to all embodiments of the present invention are operatively coupled and configured.

As shown in FIGS. 1 and 2, a light-emitting display device 1000 according to one or more embodiments of the present invention includes a substrate 100 having an active area AA including a plurality of subpixels SP and a non-display area NA (or inactive area) disposed so as to surround the active area AA.

The subpixels SP in the active area AA are regularly arranged, and an emissive portion EMP of each of the subpixels SP is defined by a bank 1400. The emissive portion EMP is defined in an open area of the bank 1400, and an organic layer 170 (see FIGS. 3A and 3B) located at the emissive portion EMP emits light. The bank 1400 overlaps the active area AA excluding the emissive portion EMP of each of the subpixels SP and to the non-display area NA disposed outside the active area AA. The bank 1400, which prevents color mixture between adjacent subpixels SP and overlays the area other than the emissive portions EMP, is formed so as to have a predetermined thickness or more. The bank 1400 has an approximately larger thickness than each organic layer included in an organic light-emitting device OLED (see FIG. 5). An example of the organic light-emitting device OLED is an organic light emitting diode. For example, the bank 1400 can have a thickness of about 1 μm to 5 μm.

The light-emitting display device 1000 according to one or more embodiments of the present invention is characterized in that a bank recess BS formed by removing a predetermined thickness from the upper surface of the bank is provided in the bank 1400.

The bank recess BS is lower than the upper surface of the bank 1400 so as to have a high step. Since organic material tends to be deposited with straightness during deposition process of the organic light-emitting device OLED, the composition (organic material) of the organic layers does not well accumulate on the sidewall of the bank recess BS, which induces discontinuous generation of the organic layers. Consequently, it is possible to prevent lateral leakage of current caused by organic layers commonly formed in adjacent subpixels.

The bank recess BS is formed in the bank 1400, and has a width less than the width of the bank 1400. As shown in FIG. 2, the bank 1400 has a cross shape between emissive portions EMP of four adjacent subpixels, and this shape is repeated, whereby the bank is formed in a matrix. As shown in FIG. 2, the bank recess BS can be formed so as to have a repeated cross shape with smaller horizontal and vertical widths than the bank 1400, or can be formed so as to have a continuous shape in the horizontal direction or in the vertical direction.

Since open circuit of the organic layer can be induced at the portion at which the bank recess BS is formed, it is possible to prevent lateral leakage of current between subpixels adjacent in the horizontal direction at the time of formation of the bank recess BS in the horizontal direction and to prevent lateral leakage of current between subpixels adjacent in the vertical direction at the time of formation of the bank recess BS in the vertical direction.

Figure 3A:
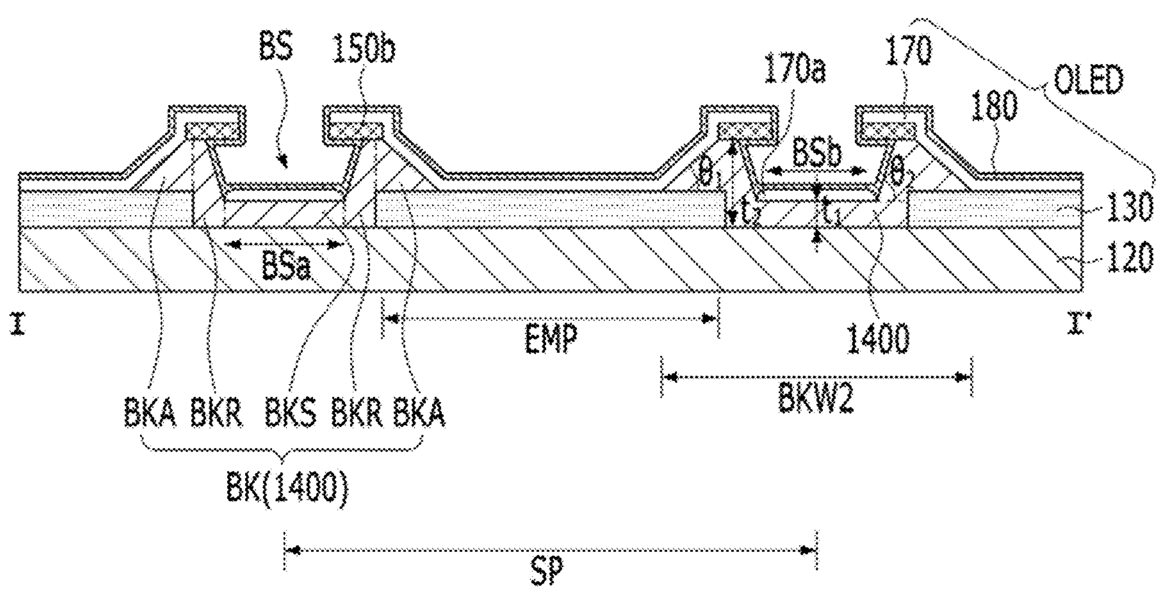
FIGS. 3A and 3B are sectional views of a light-emitting display device according to a first embodiment of the present invention taken along lines I-I' and II-II' of FIG. 2, respectively.
Figure 3B:
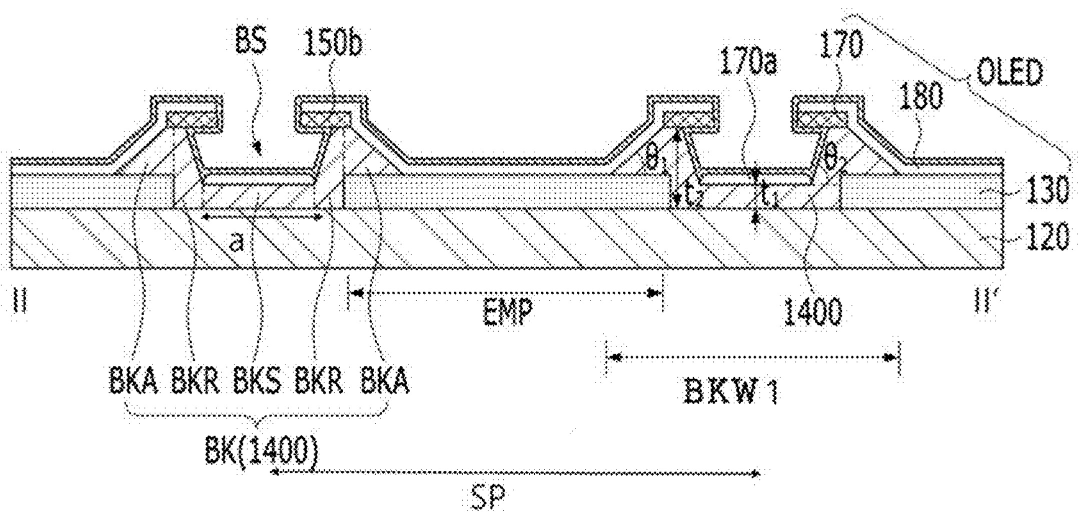
Figure 4:
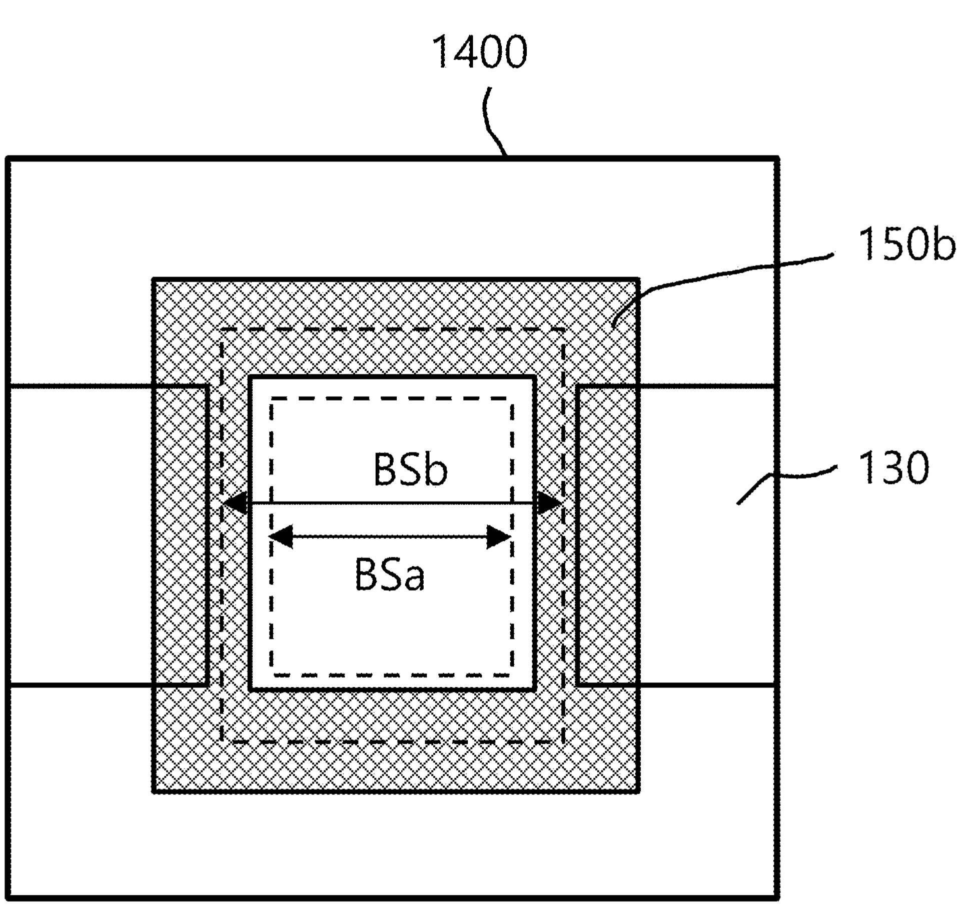
FIG. 4 is a plan view showing a relationship between a hard mask and a bank recess in the first embodiment of the present invention.

Hereinafter, the light-emitting display device according to various embodiments of the present invention will be described in detail with reference to embodiments by way of example, FIGS. 3A and 3B are sectional views of a light-emitting display device according to a first embodiment of the present invention taken along lines I-I' and II-II' of FIG. 2, respectively, and FIG. 4 is a plan view showing a relationship between a hard mask and a bank recess in the first embodiment of the present invention.

As shown in FIGS. 3A and 3B, the light-emitting display device according to the first embodiment of the present invention can include a plurality of first electrodes 130 provided on a thin film transistor array substrate 120 so as to be spaced apart from each other, a bank 1400 provided so as to overlap an area between the first electrodes 130 and the edge of each of the first electrodes, a bank recess BS provided in the bank 1400 at the area between the first electrodes 130, an organic layer 170 provided on the first electrodes 130 and the bank 1400, the organic layer being discontinuous between the upper part of the bank 1400 and the bank recess BS, and a second electrode 180 provided on the organic layer.

As shown in FIG. 2, the bank recess BS continuously extends between two adjacent subpixels SP, and lateral leakage of current can be prevented as the result of open circuit of the organic layer 170 between two adjacent subpixels.

The widths a and b of the bank recess BS can be less than the distance between the first electrodes 130 at adjacent subpixels SP. This is necessary for the bank recess BS not to affect a turn on/turn off function of an organic light-emitting device OLED vertically formed at each subpixel SP in the direction from the first electrode 130 to the second electrode 180. Depending on circumstances, the size of the emissive portion EMP can be changed based on color emitted from each subpixel, and therefore the vertical width BKW1 and the horizontal width BKW2 of the bank 1400 can be different from each other depending on which colors are emitted by adjacent subpixels. The vertical width a and the horizontal width b of the bank recess BS can be different from each other or can be equal to each other within the width of the bank 1400. When comparing FIG. 2 with FIG. 3B, the horizontal width b of the bank recess BS is shown as being equal to the lower width BSa of the bank recess BS, However, the present invention is not limited thereto. The horizontal width b or the vertical width a of the bank recess BS can have a value between the lower width BSa and the upper width BSb of the bank recess BS. In the case in which the sidewall of the bank recess BS has an inclination of 90 degrees with respect to a surface of the substrate 120, the lower width BSa and the upper width BSb of the bank recess BS are equal to each other. In this case, the horizontal width b or the vertical width a of the bank recess BS can be equal to the lower width BSa and the upper width BSb (BSa=BSb=a or b).

In addition, the light-emitting display device according to the first embodiment of the present invention can further include a hard mask pattern 150*b* provided so as to abut the upper part of the bank 1400 and to partially overlap the bank recess BS.

The hard mask pattern 150*b* is used as a mask in an etching process of forming the bank recess BS. The hard mask pattern 150*b* performs a guiding operation so that a bank material is patterned so as to be etched more than the hard mask pattern 150*b* due to an etching selectivity difference caused by the difference between the bank material and a hard mask pattern material, and undercut is induced at the interface therebetween, whereby organic layers formed in a subsequent deposition process are not generated at the undercut area.

To this end, the hard mask pattern 150*b* can be made of a material having etching selectivity difference from the bank material. For example, the hard mask pattern 150*b* can be made of an inorganic material, and the bank material can be an organic material. The inventors of the present application have experimentally confirmed that, when the hard mask pattern 150*b* is formed of a transparent metal oxide, such as indium tin oxide (ITO), the hard mask pattern has etching resistance to an etchant used to etch the bank material.

Meanwhile, the bank 1400 is formed of a polymer organic material, such as polyimide, photo acryl, or polyamide.

In the case in which the hard mask pattern 150*b* is provided, the organic layer 170 is formed on the hard mask pattern 150*b*; however, the bank recess BS is hidden by the hard mask pattern 150*b* at the portion at which the hard mask pattern 150*b* and the bank recess BS overlap each other in a deposition process, whereby an organic deposition material may not be formed at the sidewall of the bank recess BS.

When the bank recess BS has a predetermined width, an organic layer material 170*a* can also be formed on the lower part of the bank recess BS; however, the organic layer 170 is separated from the sidewall of the bank recess BS, whereby the organic layer material 170*a* on the lower part of the bank recess BS and the organic layer 170 located on the bank 1400 can be physically spaced apart from each other. Consequently, the organic layer 170 can be divided between adjacent subpixels based on the bank recess BS. In the light-emitting display device according to one or more embodiments of the present invention, therefore, it is possible to prevent lateral leakage of current.

The second electrode 180 is located on the organic layer 170, which is formed on the hard mask pattern 150*b*. In addition, the second electrode 180 can continuously extend to the sidewall of the bank recess BS and the lower part of the bank recess BS, whereby the second electrode 180 can be entirely formed in the active area AA of the thin film transistor array substrate 120 without cutting or discontinuity. When the second electrode 180 is commonly formed in the entirety of the active area AA, ground voltage or constant voltage is applied to the second electrode 180, whereby the level of the second electrode of the organic light-emitting device OLED is commonly maintained at each subpixel.

As shown in FIG. 4, the hard mask pattern 150*b* can be formed so as to surround the edge of the bank recess BS.

Ground voltage or constant voltage can be applied to the second electrode 180 so that the second electrode 180 is connected to a metal wire or to a ground metal pad in a portion of the non-display area NA.

In addition, a second angle θ2 between the surface of the thin film transistor array substrate 120 and the sidewall of the bank recess BS, rather than a first angle θ1 between a bank edge portion BKA disposed so as to overlap the first electrode 130 and the surface of the thin film transistor array substrate 120, can approximate to 90 degrees. As the sidewall of the bank recess BS approximates to 90 degrees, the organic layer 170 does not well accumulate on the sidewall of the bank recess BS, whereby open circuit of the organic layer 170 can be achieved at the sidewall of the bank recess BS.

Meanwhile, when the bank recess BS is located so as to extend through the central part of the bank 1400, it is possible to easily form a bank recess BS having a large depth.

The depth c (see FIG. 6B) of the bank recess BS is 5000 Å or more or corresponds to the thickness of the bank 1400. The depth of the bank recess BS, which is 5000 Å or more, is a depth of the bank 1400 at which the bank recess has a high step with respect to the upper surface of the bank 1400, whereby the organic layer 170 is sufficiently separated from the bank recess BS. The depth of the bank recess BS is a depth that the inventors have been confirmed through experimentation.

In this case, the largest thickness of the bank 1400 is about 1 μm to 5 μm or less, and the bank recess BS corresponds to an area formed by removing a predetermined thickness downwards from the upper part of the bank 1400.

In an area formed by etching from the upper part to the lower part of the bank recess BS, etchants permeating the upper part and the lower part are differently applied, whereby the upper width BSb is slightly greater than the lower width BSa, and the relatively large upper width BSb is located in an area between the first electrodes 130, whereby the bank 1400 can have a body portion BKR having an inherent height of the bank 1400 formed at an area at which the bank does not overlap the first electrode 130.

At this time, the hard mask pattern 150*b* has an open area formed in the center thereof so that the lower part of the bank recess BS is exposed, and the hard mask pattern 150*b* can extend through the outer edge of the bank recess Bs corresponding to the upper width BSb of the bank recess BS.

When planarly dividing the area of the bank (BK) 1400, the bank 1400 includes an overlap portion BKA disposed so as to overlap the first electrode 130, a body portion BKR connected to the overlap portion BKA, the body portion BKR having a support function, and a lower bank portion BKS corresponding to the lower part of the bank recess BS.

Meanwhile, the organic layer 170 is shown as a single layer in the drawings. However, the present invention is not limited thereto. The organic layer 170 can include at least one stack including a hole injection layer HIL, a hole transport layer HTL, an emissive layer EML, and an electron transport layer ETL. In this case, the layers other than the emissive layer EML can be selectively provided. At least one stack can be provided between the first electrode 130 and the second electrode 180. When a plurality of stacks is provided between the first and second electrodes 130 and 180, a charge generation layer can be provided between the stacks to assist transfer of holes and electrons to an adjacent upper or lower stack.

Depending on circumstances, the emissive layer EML can be commonly formed in the active area, or a deposition mask, such as a fine metal mask, can be provided so that each color emissive layer is formed for each subpixel. Here, the hole injection layer HIL, the hole transport layer HTL, and the electron transport layer ETL can be commonly formed at least in the active area AA without a deposition mask, such as a fine metal mask.

In the light-emitting display device according to the first embodiment of the present invention, continuity of a plurality of organic layers 170, such as a hole injection layer HIL, a hole transport layer HTL, and an electron transport layer ETL, is interrupted at the sidewall of the bank recess BS, which leads to open circuit of the organic layers 170, whereby it is possible to prevent lateral leakage of current.

Figure 5:
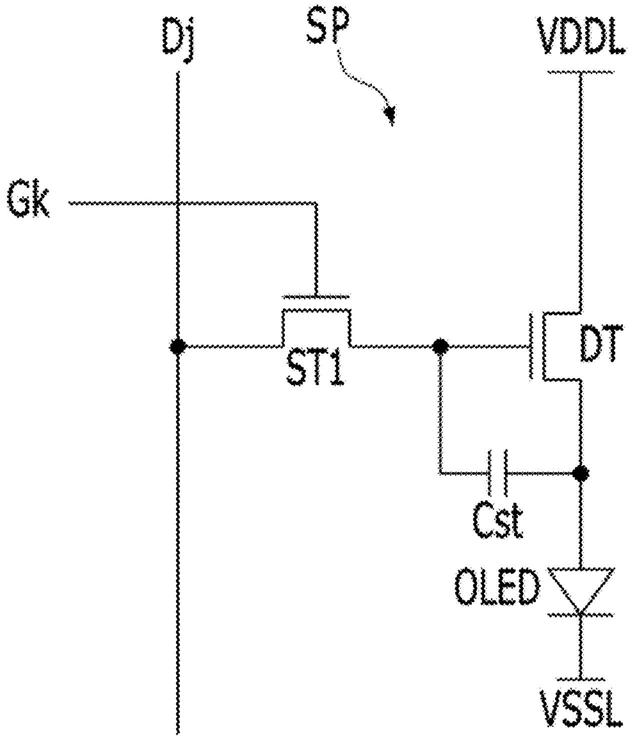
FIG. 5 is a circuit diagram of a subpixel of FIG. 2.

FIG. 5 is a circuit diagram of a subpixel of FIG. 2. For example, each of at least one of the subpixels in FIG. 2 can have the circuit diagram of FIG. 5.

Meanwhile, the thin film transistor array substrate 120 includes the substrate 100 described with reference to FIG. 1 and a thin film transistor connected to the first electrode 130 formed on the substrate 100, In this case, each subpixel includes a circuit having a thin film transistor therein, as shown in FIG. 5. The component 120 is configured so that a circuit having a thin film transistor therein, as shown in FIG. 5, is included in each subpixel on the substrate and a plurality of circuits is arranged in the form of an array, whereby the component 120 is referred to as a thin film transistor array substrate 120.

Specifically, as shown in FIG. 5, each subpixel SP is defined by a gate line Gk and a data line Dj, which intersect each other. A switching transistor ST1 is connected to the gate line Gk and the data line Dj, is provided at the intersection therebetween, is turned on by a gate signal of the gate line Gk, and is switched by data voltage of the data line Dj. Depending on circumstances, a plurality of switching transistors ST1 can be provided.

A drive transistor DT is disposed between a second power supply voltage line VDDL configured to supply second power supply voltage and an organic light-emitting device (OLED). The drive transistor DT adjusts current that flows from the second power supply voltage line VDDL to the organic light-emitting device (OLED) based on the voltage difference between a gate electrode and a source electrode thereof. The gate electrode of the drive transistor DT can be connected to a source electrode of the switching transistor ST1, a drain electrode of the drive transistor DT can be connected to the second power supply voltage line VDDL, and the source electrode of the drive transistor DT can be connected to a first electrode of the organic light-emitting device (OLED). The second power supply voltage line VDDL can be a high-potential voltage line configured to supply high-potential power supply voltage.

The organic light-emitting device (OLED) emits light based on current that is supplied through the drive transistor DT. The first electrode (anode) (130 of FIGS. 3A and 3B) of the organic light-emitting device (OLED) can be connected to the source electrode of the drive transistor DT, and a second electrode (cathode) of the organic light-emitting device (OLED) can be connected to a first power supply voltage line VSSL (180 of FIGS. 3A and 3B) configured to supply first power supply voltage. The first power supply voltage line VSSL can be a low-potential voltage line configured to supply low-potential power supply voltage.

The organic light-emitting device (OLED) can include a first electrode, a hole transport layer, an emissive layer, an electron transport layer, and a second electrode. When voltage is applied to the first electrode and the second electrode, holes and electrons move to the emissive layer through the hole transport layer and the electron transport layer, and are recombined at the emissive layer, whereby the organic light-emitting device (OLED) emits light. The emissive layer can be an organic emissive layer or an inorganic emissive layer. In addition to the emissive layer, the hole transport layer and/or the electron transport layer, which has a carrier transport function, can be an organic layer or an inorganic layer. One thereof can be an organic layer, and can be commonly formed in the active area AA.

A capacitor Cst is formed between the gate electrode and the source electrode of the drive transistor DT, and stores differential voltage between gate voltage and source voltage of the drive transistor DT.

One electrode of the capacitor Cst can be connected to the gate electrode of the drive transistor DT and the source electrode of the switching transistor ST1, and the other electrode of the capacitor Cst can be connected to the source electrode of the drive transistor DT and the first electrode of the organic light-emitting device (OLED).

Meanwhile, a pad unit PAD can be provided in a portion of the non-display area NA of FIG. 1. Pad electrodes, to which the gate line Gk, the data line Dj, and the first and second power supply voltage lines VSSL and VDDL provided in each subpixel SP extend and are connected, are provided in the pad unit. Each of the pad electrodes is connected to a flexible film and applies a voltage signal to each line.

Meanwhile, the emissive layer can be an organic emissive layer, in which case the light-emitting display device according to one or more embodiments of the present invention can be used as an organic light-emitting display device. Depending on circumstances, the emissive layer can be a quantum-dot emissive layer, in which case the light-emitting display device according to one or more embodiments of the present invention can be used as a quantum-dot light-emitting display device. In the case in which any other display device has a structure in which a common layer is provided between adjacent subpixels, the bank recess can be provided in the bank structure of the light-emitting display device according to one or more embodiments of the present invention in order to prevent lateral leakage of current.

Hereinafter, a method of manufacturing the light-emitting display device according to the first embodiment of the present invention will be described.

FIGS. 6A to 6G are process sectional views showing a method of manufacturing the light-emitting display device according to the first embodiment of the present invention.

Figure 6A:
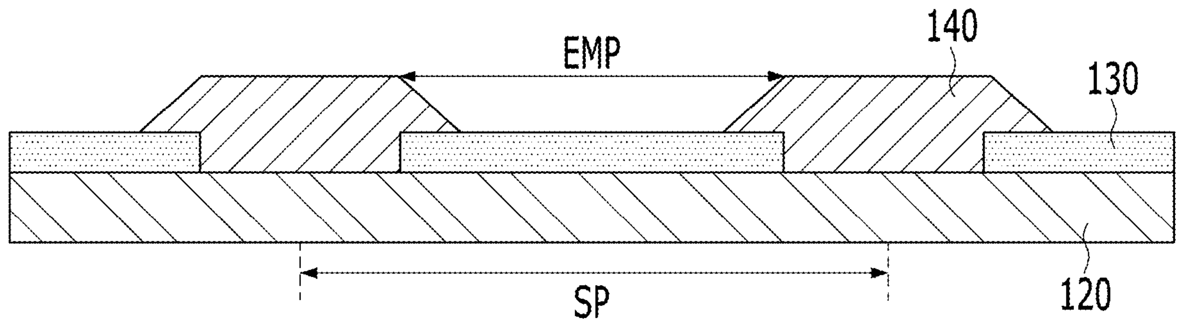
FIGS. 6A to 6G are process sectional views showing a method of manufacturing the light-emitting display device according to the first embodiment of the present invention.

As shown in FIG. 6A, a first electrode 130 is formed on a thin film transistor array substrate 120 for each subpixel SP.

Subsequently, a bank 140 is formed so as to overlap an area between the first electrodes 130 and the edge of each of the first electrodes 130.

Figure 6B:
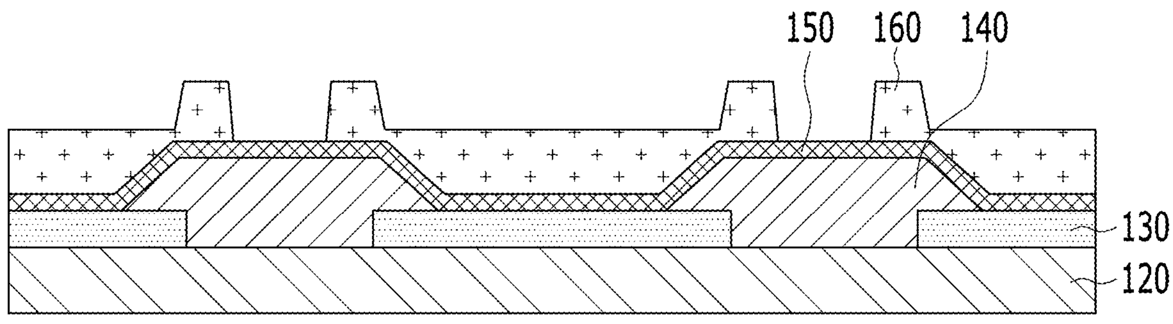

Subsequently, as shown in FIG. 6B, a hard mask layer 150 is formed on the first electrodes 130 and the bank 140.

Subsequently, a first photoresist pattern 160 configured to expose the hard mask layer 150 is formed on a portion of the area between the first electrodes 130.

Figure 6C:
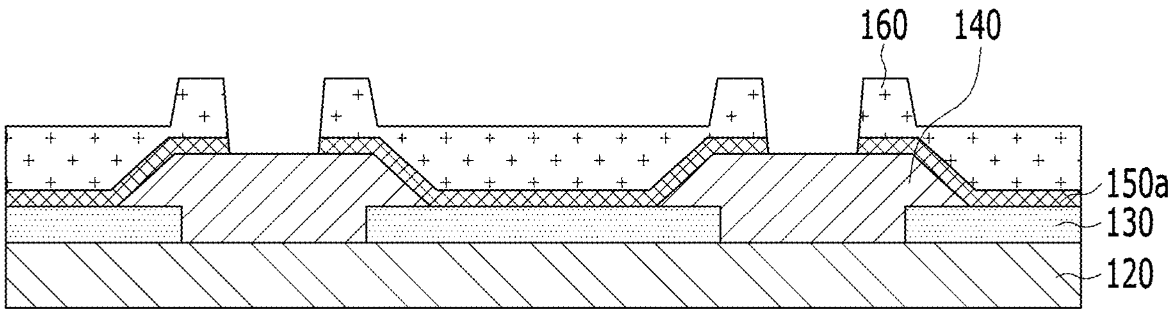

As shown in FIG. 6C, the hard mask layer 150 is patterned using the first photoresist pattern 160 as a mask to form a primary hard mask layer pattern 150*a*. The primary hard mask layer pattern 150*a* is formed by removing the portion exposed through the first photoresist pattern 160.

Figure 6D:
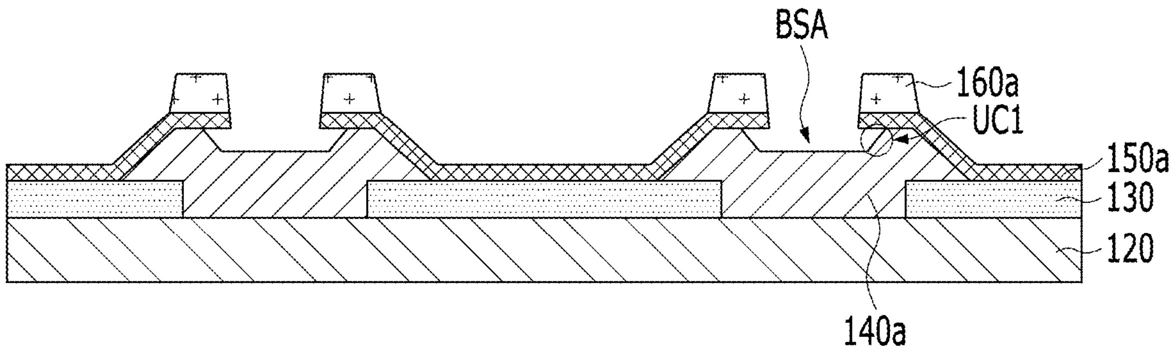

Subsequently, the first photoresist pattern 160 is patterned in a shape in which an emissive portion EMP is exposed to form a second photoresist pattern 160*a*, as shown in FIG. 6D.

At the time of dry etching using the second photoresist pattern 160*a*, a portion of the exposed upper part of the bank and a portion of the upper part of the bank overlapping the primary hard mask layer pattern 150*a* are removed, since the etching selectivity of a bank material is higher than the etching selectivity of the primary hard mask layer pattern 150*a*, whereby a primary bank removal area BSA is generated. In this process, the portion of the bank that has overlapped the primary hard mask layer pattern 150*a* and has been removed appears as a first undercut UC1 under the primary hard mask layer pattern 150*a*.

Figure 6E:
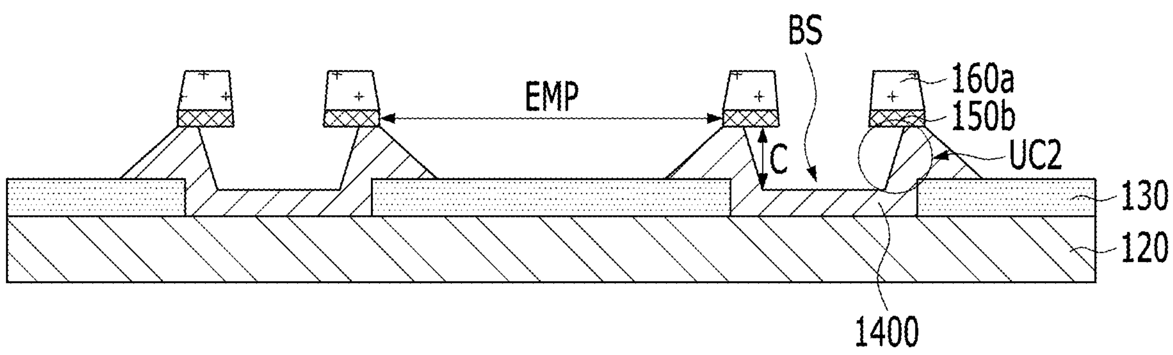

As shown in FIG. 6E, the exposed portion of the hard mask layer pattern is etched using the second photoresist pattern 160*a* as a mask to form a hard mask layer pattern 150*b*. In this process, the exposed portion of the bank material between the hard mask layer patterns 150*b* of adjacent subpixels is also removed by a predetermined thickness, whereby a bank recess BS having a predetermined depth c is formed. In this process, a deepened second undercut UC2 is generated at the area at which the bank 140 was located under the hard mask layer pattern 150*b*.

Figure 6F:
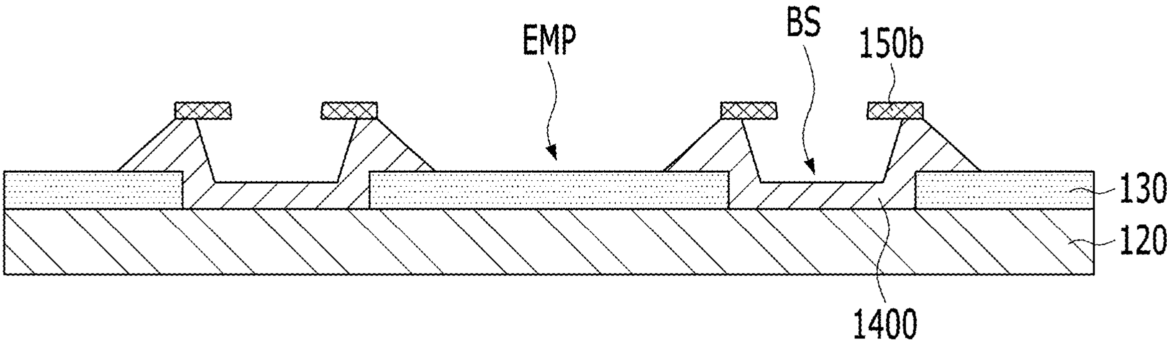

Subsequently, as shown in FIG. 6F, the second photoresist pattern 160*a* is removed by stripping. The open area of a bank 1400 on the first electrode 130 is defined as an emissive portion EMP, and the area inside the hard mask layer pattern 150*b* in the bank 1400 is defined as a bank recess BS.

Figure 6G:
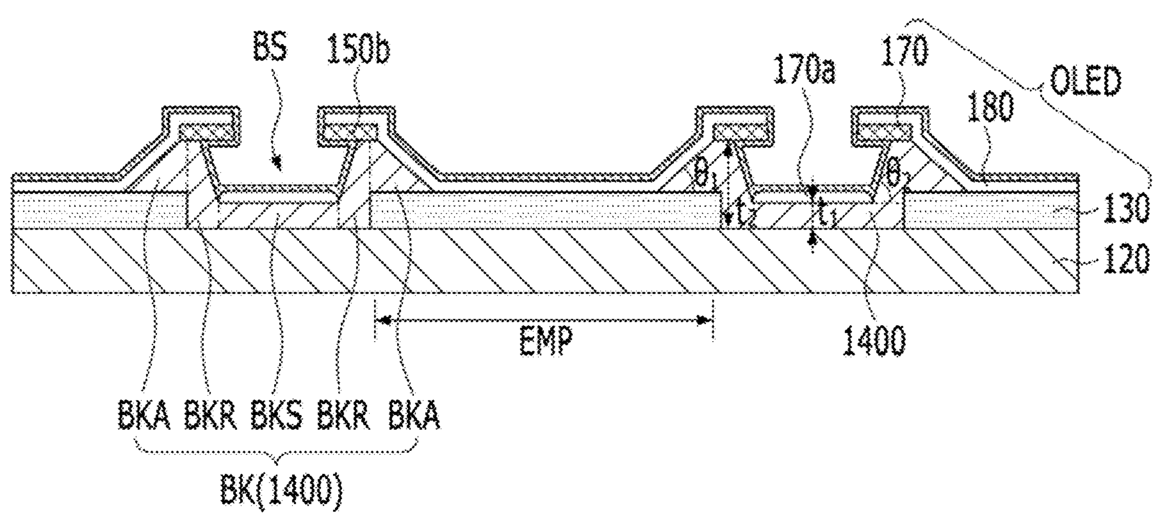

When an organic material is deposited to form an organic layer 170 including a hole injection layer, a hole transport layer, an emissive layer, and an electron transport layer in the state of having the hard mask layer pattern 150*b* shown in FIG. 6G, open circuit of the organic layer 170 occurs at the side part of the bank recess BS. For example, the organic layer 170 accumulates in the vertical direction during the deposition process, and extends to the hard mask layer pattern 150*b* including the emissive portion EMP. The side part of the bank recess BS is hidden by the hard mask layer pattern 150*b*, whereby open circuit of the organic layer 170 occurs, and an organic layer material 170*a* is separated from the organic layer 170 and remains on the flat surface of the lower part of the bank recess BS. In this case, the organic layer material 170*a* located at the lower part of the bank recess BS remains in the bank recess in the shape of an island and serves as a non-conductive medium.

After formation of the organic layer 170, a second electrode 180 is formed. A metal material can be formed at the side part of the bank recess BS as well as the upper parts of the organic layer 170 and the organic layer material 170*a*, since the metal material has higher step coverage than an organic material. Consequently, the second electrode 180 can be formed so as to overlay the entire active area.

The first electrode 130, the organic layer 170, and the second electrode 180, formed as described above, constitute an organic light-emitting device (OLED).

Figure 7:
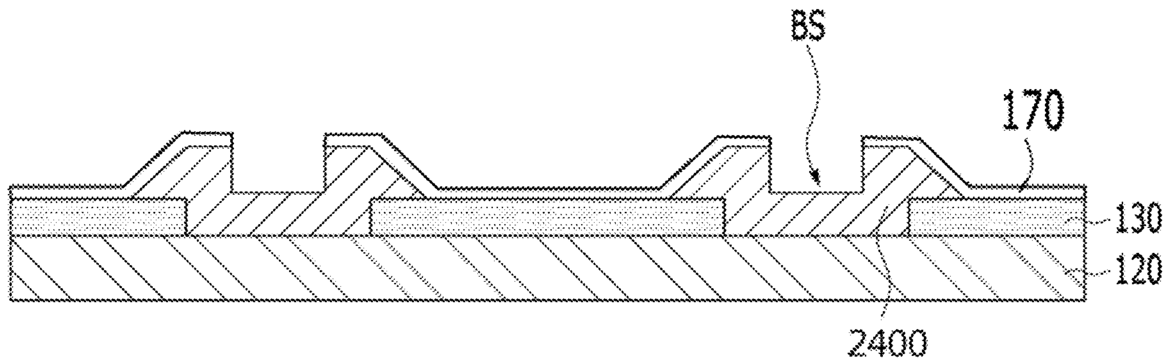
FIG. 7 is a sectional view of a light-emitting display device according to a second embodiment of the present invention taken along line I-I' of FIG. 2.

FIG. 7 is a sectional view of a light-emitting display device according to a second embodiment of the present invention taken along line I-I' of FIG. 2.

As shown in FIG. 7, in the light-emitting display device according to the second embodiment of the present invention, no hard mask layer pattern is provided, and a bank recess BS having an inclined structure is formed from the upper part of a bank 2400.

In this case, the side part of the bank recess BS has a sidewall perpendicular to the surface of a thin film transistor array substrate 120. At the time of formation of an organic layer 170, therefore, it is difficult for the organic layer 170 to be formed at the sidewall, which as a high step, or only a portion of the organic layer 170 is formed, whereby open circuit of the organic layer 170 occurs at the sidewall. In the second embodiment, the organic layer 170 is not commonly formed at adjacent subpixels, whereby it is possible to prevent lateral leakage of current due to the organic layer 170 commonly formed at subpixels, in the same manner as in the first embodiment.

Referring to FIG. 7, a second electrode is continuously formed on a first electrode 130, on the bank 2400, and in the bank recess BS. The second embodiment of the present invention is characterized in that open circuit of the organic layer 170 is achieved based on the shape of the bank 2400 and the bank recess BS, and therefore the second photoresist pattern is omitted.

Hereinafter, a method of manufacturing the light-emitting display device according to the second embodiment of the present invention will be described.

FIGS. 8A to 8D are process sectional views showing a method of manufacturing the light-emitting display device according to the second embodiment of the present invention.

The method of manufacturing the light-emitting display device according to the second embodiment of the present invention is performed through the following steps.

Figure 8A:
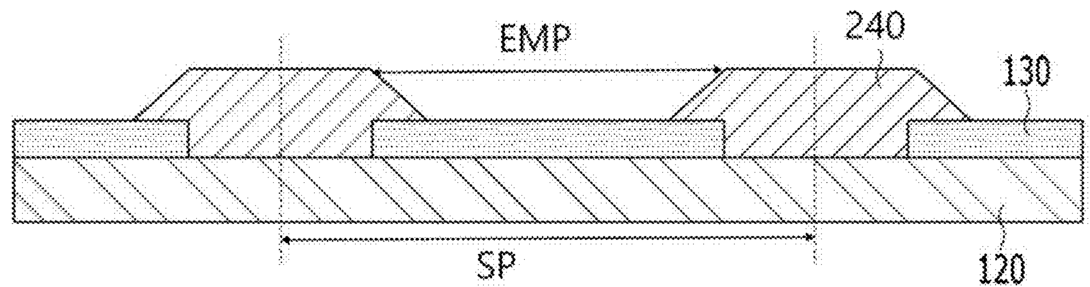
FIGS. 8A to 8D are process sectional views showing a method of manufacturing the light-emitting display device according to the second embodiment of the present invention.

As shown in FIG. 8A, a first electrode 130 is formed on a thin film transistor array substrate 120 for each subpixel SP.

Subsequently, a bank 240 is formed so as to overlap an area between the first electrodes 130 and the edge of each of the first electrodes 130.

Figure 8B:
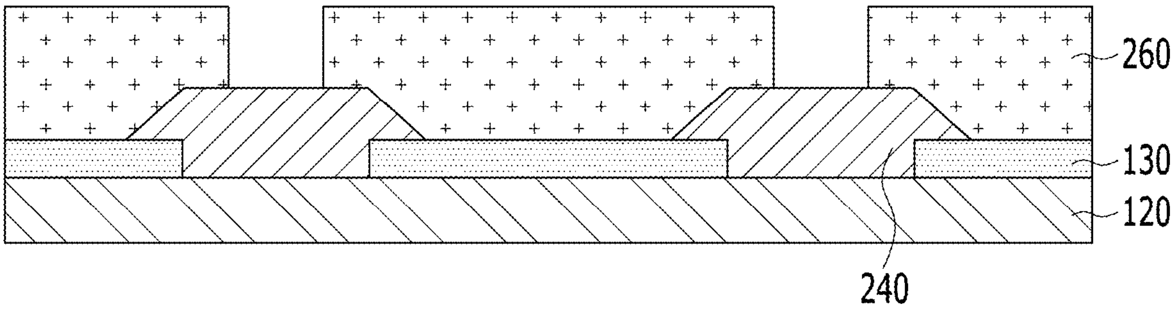

Subsequently, as shown in FIG. 8B, a photoresist pattern 260 having an exposed portion of the bank 240 is formed on the first electrodes 130, the bank 240, and a portion of the area between the first electrodes 130.

Here, the edge of the photoresist pattern 260 that exposes a portion of the bank 240 is almost vertical.

Figure 8C:
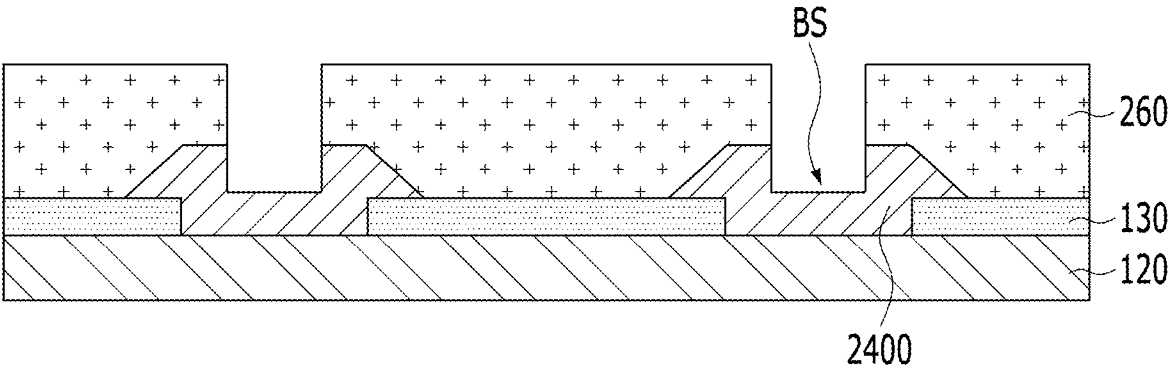

Subsequently, as shown in FIG. 8C, a bank recess BS having a predetermined depth from the upper part of the bank 240 is formed using the photoresist pattern 260 as a mask. At this time, the sidewall of the bank recess BS can be formed so as to have an inclined structure almost perpendicular to the surface of the thin film transistor array substrate 120, similarly to the inclined structure of the edge of the photoresist pattern 260.

Figure 8D:
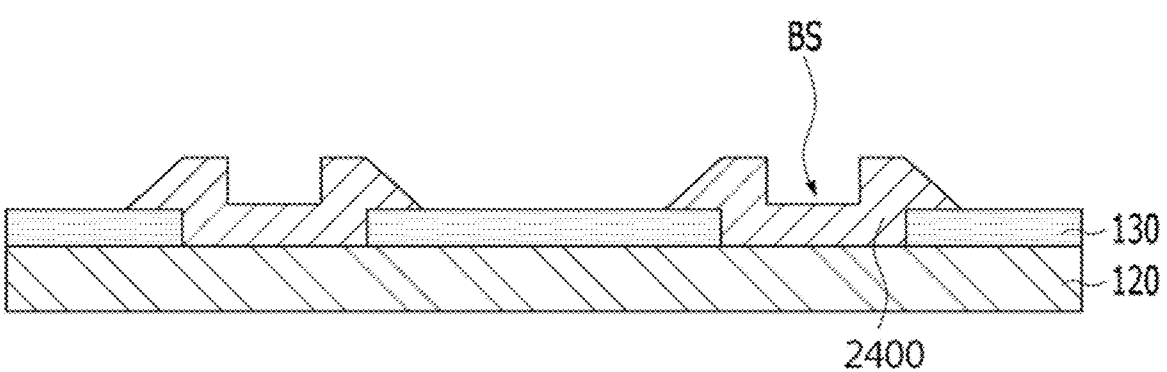

Subsequently, as shown in FIG. 8D, the photoresist pattern 260 is removed by stripping to form a bank 2400 having a bank recess BS formed therein so as to have a predetermined depth from the upper part thereof.

In the light-emitting display device according to the second embodiment of the present invention, discontinuity of an organic layer 170 is achieved at the sidewall of the bank recess BS, whereby it is possible to prevent lateral leakage of current due to continuity of the organic layer between adjacent subpixels, in the same manner as in the first embodiment.

Figure 9:
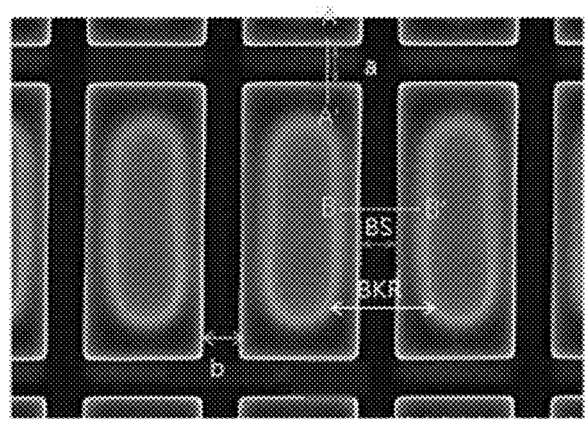
FIG. 9 is an SEM view showing an example of the plane of a portion of the light-emitting display device after a bank slit of FIG. 8D is formed.
Figure 10:
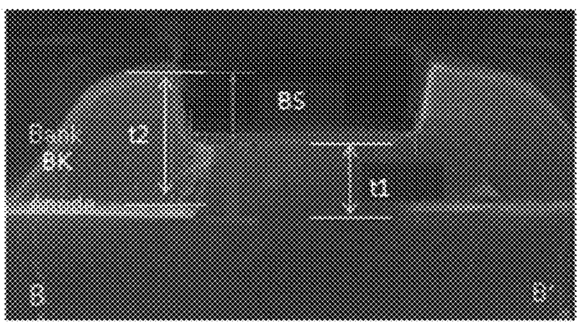
FIG. 10 is an SEM view showing an example of the section of a bank slit formation portion after the bank slit of FIG. 8D is formed.

FIG. 9 is an SEM view showing an example of the plane of a portion of the light-emitting display device after a bank slit of FIG. 8D is formed, and FIG. 10 is an SEM view showing an example of the section of a bank slit formation portion after the bank slit of FIG. 8D is formed.

The inventors of the present application have confirmed that a bank recess BS having a predetermined horizontal width and a predetermined vertical width was formed in the bank BK at the time of manufacturing the light-emitting display device according to the second embodiment of the present invention, as shown in FIG. 9, and have confirmed that the depth of the bank recess was about ½ the thickness of the body portion BKR of the bank, as shown in FIG. 10. For example, the inventors of the present application have confirmed that a high step could be formed between the bank recess and the upper part of the bank, from which the inventors of the present application have structurally confirmed that the organic layer was open-circuited at the sidewall of the bank recess, whereby it was possible to prevent leakage of current.

Meanwhile, the inventors of the present application have confirmed that the shapes of the bank and the bank recess of FIGS. 9 and 10 appear at the center and the edge of the substrate with little deviation. As a result, it is expected that a current leakage problem can be solved without unbalance depending on the area of the substrate.

In the light-emitting display device according to one or more embodiments of the present invention, as described above, a bank recess having a predetermined step from the upper surface of the bank is provided in the bank formed after the first electrode is formed. Consequently, the organic layer formed after the bank is formed is structurally separated from the bank recess, whereby it is difficult to form an organic common layer, and therefore it is possible to prevent lateral leakage of current between subpixels.

In addition, a hard mask having a hole is provided on the bank, and a bank recess having a larger width than the hard mask is defined using the hard mask and an organic and inorganic selectivity difference, whereby the hard mask remains in the state of partially overlapping the bank recess. At the time of formation of the organic layer, therefore, the organic layer is blocked by the overlap portion between the hard mask and the bank recess, whereby open circuit of the organic layer is achieved and thus separation of the organic layer between subpixels is possible. Consequently, it is possible to structurally prevent lateral leakage of current.

In addition, the bank recess is provided in a bank having a predetermined height or higher. Consequently, a separate area having an undercut is not provided, and the undercut is defined at the portion of the bank that defines an emissive portion of each subpixel, whereby it is possible to form a structure capable of preventing lateral leakage of current without enlargement of a planar ineffective area.

Also, in a structure in which the distance between adjacent subpixels is reduced, whereby leakage of current is caused, no specific structure is added in order to prevent lateral leakage of current, a step is formed by the provision of a recess in the bank, and therefore it is possible to form an organic layer of each subpixel in the shape of an island, which is advantageously applicable particularly to a high resolution structure or an ultra-high resolution structure.

Meanwhile, the second electrode, which is formed after the organic common layer is formed, is made of a metal material, which has relatively excellent step coverage characteristics, and therefore the second electrode can be continuously formed even at the bank recess and the circumference thereof.

To this end, a light-emitting display device according to a first embodiment of the present invention can include a plurality of first electrodes spaced apart from each other on a substrate, a bank provided to overlap an area between the first electrodes and the edge of each of the first electrodes, a bank recess provided in the bank at the area between the first electrodes, an organic layer on the first electrodes and the bank, the organic layer being discontinuous between the upper part of the bank and the bank recess, and a second electrode on the organic layer.

The bank recess can continuously extend between two adjacent subpixels.

The width of the bank recess can be less than the distance between the first electrodes of adjacent subpixels.

The light-emitting display device can further include a hard mask layer to abut the upper part of the bank and to partially overlap the bank recess.

The organic layer can be formed on the hard mask layer, and may not be formed at the sidewall of the bank recess at which the hard mask layer and the bank recess overlap each other.

The organic layer can be spaced apart from an organic layer material provided on the lower part of the bank recess.

The second electrode can be continuously provided from the upper part of the organic layer on the hard mask layer to the sidewall of the bank recess and the lower part of the bank recess.

A bank edge portion overlapping with the first electrode has a first angle $\theta_1$ with respect to a surface of the substrate. And a sidewall of the bank recess has a second angle $\theta_2$ with respect to the surface of the substrate. The second angle can be closer to 90 degrees than the first angle.

The bank recess can be extended over the central part of the bank.

The bank recess can have a step having a depth of 5000 Å or more from the upper part of the bank.

The bank can include a bank material having a first height between the bank recess and the substrate.

In a plan view, the bank can include a bank body portion provided around the bank recess, the bank body portion having a second height greater than the first height, and a bank overlap portion connected to the bank body portion so as to overlap each first electrode.

In addition, a light-emitting display device according to another embodiment of the present invention can include a plurality of first electrodes provided on a substrate so as to be spaced apart from each other, a bank provided so as to overlap an area between the first electrodes and the edge of each of the first electrodes, a bank recess provided in the bank at the area between the first electrodes, a hard mask layer pattern provided so as to partially overlap the bank recess and to abut the upper part of the bank, an organic layer provided on the first electrodes and the bank, the organic layer being discontinuous between the upper part of the hard mask layer pattern and the bank recess, and a second electrode provided on the organic layer.

The hard mask layer pattern can have an open area smaller than the outer width of the bank recess.

Also, in order to accomplish the same object, a method of manufacturing a light-emitting display device according to one or more embodiments of the present invention can include providing a plurality of first electrodes on a substrate so as to be spaced apart from each other, providing a bank so as to overlap an area between the first electrodes and the edge of each of the first electrodes, providing a bank recess in the bank at the area between the first electrodes, providing an organic layer on the first electrodes and the bank, the organic layer being discontinuous between the upper part of the bank and the bank recess, and providing a second electrode on the organic layer.

As is apparent from the above description, a light-emitting display device according to one or more embodiments of the present invention and the method of manufacturing the same have the following effects.

First, a bank recess having a predetermined step from the upper surface of a bank is provided in the bank, which is formed after a first electrode is formed. Consequently, an organic layer formed after the bank is formed is structurally separated from the bank recess, whereby it is difficult to form an organic common layer, and therefore it is possible to prevent lateral leakage of current between subpixels.

Second, a hard mask having a hole is provided on the bank, and a bank recess having a larger width than the hard mask is defined using the hard mask and an organic and inorganic selectivity difference, whereby the hard mask remains in the state of partially overlapping the bank recess. At the time of formation of the organic layer, therefore, the organic layer is blocked by the overlap portion between the hard mask and the bank recess, whereby open circuit of the organic layer is achieved and thus separation of the organic layer between subpixels is possible. Consequently, it is possible to structurally prevent lateral leakage of current.

Third, the bank recess is provided in a bank having a predetermined height or higher. Consequently, a separate area having an undercut is not provided, and the undercut is defined at the portion of the bank that defines an emissive portion of each subpixel, whereby it is possible to form a structure capable of preventing lateral leakage of current without enlargement of a planar ineffective area.

Fourth, in a structure in which the distance between adjacent subpixels is reduced, whereby leakage of current is caused, no specific structure is added in order to prevent lateral leakage of current, a step is formed by the provision of a recess in the bank, and therefore it is possible to form an organic layer of each subpixel in the shape of an island, which is advantageously applicable particularly to a high resolution structure or an ultra-high resolution structure.

Fifth, a second electrode, which is formed after the organic common layer is formed, is made of a metal material, which has relatively excellent step coverage characteristics, and therefore the second electrode can be continuously formed even at the bank recess and the circumference thereof.

It will be apparent to those skilled in the art that the present invention described above is not limited to the above embodiments and the accompanying drawings and that various substitutions, modifications, and variations can be made without departing from the technical idea of the present invention.

What is claimed is:

1. A light-emitting display device comprising:

a plurality of first electrodes spaced apart from each other over a substrate;

a bank to overlap an area between the first electrodes and an edge of each of the first electrodes;

a bank recess provided in the bank at the area between the first electrodes;

a hard mask pattern to abut an upper part of the bank, the hard mask pattern including an open area to expose the bank recess and comprising a transparent oxide metal;

an organic layer on the first electrodes and the bank, the organic layer being discontinuous between an upper part of the hard mask pattern and the bank recess; and a second electrode over the organic layer, wherein the bank comprises:

a bank lower portion having a first height under the bank recess, a bank body portion provided around the bank recess, the bank body portion having an acute taper with respect to a surface of the substrate, and a bank overlap portion connected to the bank body portion to overlap each of the plurality of first electrodes, wherein the hard mask pattern has a closed ring shape in a plan view that surrounds the open area and extends in parallel from an upper part of the bank body portion, and the hard mask pattern overlaps a part of the bank lower portion under the bank recess and is spaced apart from the part of the bank lower portion.

2. The light-emitting display device according to claim 1, wherein a width of the open area of the hard mask pattern is smaller than an outer width of the bank recess.

3. The light-emitting display device according to claim 1, wherein a width of the bank lower portion is less than a distance between two adjacent first electrodes of adjacent subpixels.

4. The light-emitting display device according to claim 1, wherein the hard mask pattern includes a first part positioned at the upper part of the bank body portion surrounding the bank recess and a second part horizontally extended from the first part to partially overlap the bank recess.

5. The light-emitting display device according to claim 4, wherein the first part of the hard mask pattern abuts the upper part of the bank body portion and the second part of the hard mask pattern has a vertical gap with the overlapped bank recess.

6. The light-emitting display device according to claim 1, wherein the organic layer is formed on the hard mask pattern and is not formed at a sidewall of the bank recess at which the hard mask pattern and the bank recess overlap each other.

7. The light-emitting display device according to claim 6, wherein the second electrode is continuously provided on an upper part of the organic layer above the hard mask pattern, the sidewall of the bank recess and an upper part of the organic layer above a bottom of the bank recess, and wherein the second electrode is directly in contact with the sidewall of the bank recess.

8. The light-emitting display device according to claim 1, wherein the bank recess is extended over a central part of the bank.

9. The light-emitting display device according to claim 4, wherein the bank recess has a step having a depth of approximately 5000 Å or more from the upper part of the bank body portion of the bank.

10. The light-emitting display device according to claim 1, wherein a part of the second electrode is positioned on a sidewall and a lower surface of the hard mask pattern.

11. The light-emitting display device according to claim 1, wherein the bank body portion extends upward from an edge of each of the plurality of first electrode to form the acute taper with respect to the surface of the substrate to surround the bank recess.

12. The light-emitting display device according to claim 1, wherein the hard mask pattern overlaps the part of the bank lower portion to expose a part of the bank lower portion under the bank recess.

13. The light-emitting display device according to claim 1, wherein the bank body portion adjacent to an edge of each of the plurality of first electrodes connects the bank lower portion positioned under the bank recess and the bank overlap portion positioned above each of the plurality of first electrode.

14. A light-emitting display device comprising:

a plurality of first electrodes spaced apart from each other over a substrate;

a bank to overlap an area between the first electrodes and an edge of each of the plurality of first electrodes;

a bank recess provided in the bank at the area between the first electrodes;

a hard mask pattern being in direct contact with an upper part of the bank, including an extending portion parallel to the upper part of the bank in order to overlap the bank recess, and comprising a transparent oxide metal;

an organic layer on the first electrodes and the bank, the organic layer being discontinuous between an upper part of the hard mask pattern and the bank recess; and a second electrode over the organic layer, wherein the bank comprises:

a bank lower portion having a first height under the bank recess, a bank body portion provided around the bank recess, the bank body portion having an acute taper with respect to a surface of the substrate, and a bank overlap portion connected to the bank body portion to overlap each of the plurality of first electrodes, wherein the hard mask pattern has a closed ring shape in a plan view that surrounds the bank recess, and wherein the extending portion of the hard mask pattern overlaps a part of the bank lower portion under the bank recess and is vertically spaced apart from the part of the bank lower portion under the bank recess.

15. The light-emitting display device according to claim 14, wherein the hard mask pattern has an open area to expose the bank recess.

16. The light-emitting display device according to claim 14, wherein the hard mask pattern is not present at a side surface of the bank body portion around the bank recess and a surface of the bank lower portion.

17. The light-emitting display device according to claim 14, wherein a part of the second electrode is positioned on a sidewall and a lower surface of the hard mask pattern.

18. The light-emitting display device according to claim 14, wherein a width of an open area of the hard mask pattern above the bank recess is smaller than a width of a bottom of the bank recess.

19. The light-emitting display device according to claim 14, wherein the second electrode is in direct contact with a surface of the bank body portion around the bank recess.

20. The light-emitting display device according to claim 14, wherein the hard mask pattern is thinner than each of the plurality of first electrodes.

21. The light-emitting display device according to claim 1, wherein the hard mask pattern is thinner than each of the plurality of first electrodes.

* * * * *